(12) United States Patent
Erkens

(10) Patent No.: US 9,442,143 B2
(45) Date of Patent: Sep. 13, 2016

(54) CAPACITIVE PROXIMITY SENSOR AS WELL AS METHOD FOR CAPACITIVE APPROXIMATION DETECTION

(75) Inventor: Holger Erkens, Düsseldorf (DE)

(73) Assignee: MICROCHIP TECHNOLOGY GERMANY GMBH, Gilching (DE)

(*) Notice: Subject to any disclaimer, the term of this patent is extended or adjusted under 35 U.S.C. 154(b) by 257 days.

(21) Appl. No.: 13/977,724

(22) PCT Filed: Jan. 3, 2012

(86) PCT No.: PCT/EP2012/050059
§ 371 (c)(1),
(2), (4) Date: Feb. 12, 2014

(87) PCT Pub. No.: WO2012/093124
PCT Pub. Date: Jul. 12, 2012

(65) Prior Publication Data
US 2014/0152327 A1    Jun. 5, 2014

(30) Foreign Application Priority Data

Jan. 4, 2011 (DE) .................. 10 2011 002 447

(51) Int. Cl.
*G01R 27/26* (2006.01)
*H03K 17/955* (2006.01)
*H03K 17/96* (2006.01)

(52) U.S. Cl.
CPC ......... *G01R 27/2605* (2013.01); *H03K 17/955* (2013.01); *H03K 2017/9613* (2013.01); *H03K 2217/96073* (2013.01); *H03K 2217/960705* (2013.01); *H03K 2217/960745* (2013.01)

(58) Field of Classification Search
CPC ........... G01R 27/2605; H03K 17/955; H03K 2017/9613; H03K 2017/9615; H03K 2217/960705; H03K 2217/960745

USPC .......... 324/679, 663, 686–690; 327/563, 359
See application file for complete search history.

(56) References Cited

U.S. PATENT DOCUMENTS 3,886,447 A * 5/1975 Tanaka ........................ 324/678
3,924,177 A   12/1975 Lemineur et al. ............ 324/725

(Continued)

FOREIGN PATENT DOCUMENTS

| CN | 101078774 A | 11/2007 | ............... G01V 3/08 |
| CN | 101815956 A | 8/2010 | ............... G01V 3/08 |

(Continued)

OTHER PUBLICATIONS

International Search Report and Written Opinion, Application No. PCT/EP2012/050059, 19 pages, Jul. 3, 2012.

(Continued)

*Primary Examiner* — Melissa Koval
*Assistant Examiner* — Rahul Maini
(74) *Attorney, Agent, or Firm* — Slayden Grubert Beard PLLC

(57) ABSTRACT

A capacitive proximity sensor has a first sensor electrode and a second sensor electrode, a signal generator for providing a first and a second electric alternating signal, a first load element which comprises a first and a second electric load, in which the first alternating signal by the first load can be fed to the first sensor electrode and the second alternating signal by the second load to the second sensor electrode, and wherein the electric loads each together with the capacitive load to be measured at the respective sensor electrode form a lowpass filter, and a signal processing device, which is coupled with the first sensor electrode and with the second sensor electrode, and which is adapted to form a first measurement value from the push-pull portion of a first electric parameter tapped at the first sensor electrode and a second electric parameter tapped at the second sensor electrode.

17 Claims, 6 Drawing Sheets

(56) References Cited

U.S. PATENT DOCUMENTS

| | | | |
|---|---|---|---|
| 4,226,535 A | 10/1980 | Heitmann et al. | 356/28 |
| 5,065,105 A * | 11/1991 | Bruere et al. | 324/662 |
| 5,879,308 A * | 3/1999 | Rasanen | A61B 5/0809 600/513 |
| 6,664,661 B1 | 12/2003 | Palata et al. | 307/112 |
| 7,154,393 B2 * | 12/2006 | Okushima et al. | 340/562 |
| 7,782,220 B2 | 8/2010 | Nakamura et al. | 340/686.6 |
| 8,089,289 B1 * | 1/2012 | Kremin et al. | 324/678 |
| 8,106,668 B2 * | 1/2012 | Matsushima | 324/686 |
| 8,358,226 B2 * | 1/2013 | Reynolds | G06F 3/0202 178/18.06 |
| 8,692,565 B2 | 4/2014 | Togura | 324/679 |
| 2007/0084644 A1 * | 4/2007 | Chung et al. | 178/18.06 |
| 2008/0265914 A1 | 10/2008 | Matsushima | 324/686 |
| 2009/0146668 A1 * | 6/2009 | Wuerstlein | 324/663 |
| 2013/0271164 A1 * | 10/2013 | Savich | G01R 27/2605 324/679 |

FOREIGN PATENT DOCUMENTS

| | | | |
|---|---|---|---|
| DE | 2417964 C3 | 7/1980 | G01B 7/30 |
| DE | 2736583 C2 | 11/1985 | G01B 11/00 |
| DE | 202006010813 U1 | 11/2007 | B60J 7/057 |
| GB | 2448821 A | 10/2008 | G01D 5/24 |
| WO | 2012/093124 A2 | 7/2012 | H03K 17/955 |

OTHER PUBLICATIONS

Chinese Office Action, Application No. 201280007526.1, 8 pages, Aug. 5, 2015.
Chinese Office Action, Application No. 201280007526.1, 5 pages, Mar. 17, 2016.

* cited by examiner

US 9,442,143 B2

CAPACITIVE PROXIMITY SENSOR AS WELL AS METHOD FOR CAPACITIVE APPROXIMATION DETECTION

CROSS-REFERENCE TO RELATED APPLICATIONS

This application is a U.S. National Stage Application of International Application No. PCT/EP2012/050059 filed Jan. 3, 2012, which designates the United States of America, and claims priority to DE Patent Application No. 10 2011 002 447.6 filed Jan. 4, 2011. The contents of which are hereby incorporated by reference in their entirety.

TECHNICAL FIELD

The invention relates to a capacitive proximity sensor for detecting an approach of an object to the sensor electrodes of the capacitive proximity sensor as well as a method for the capacitive detection of an approach of an object to a capacitive proximity sensor according to the invention. Moreover the invention concerns a hand-held device, especially an electrical hand-held device with at least one capacitive proximity sensor according to the invention.

BACKGROUND

With capacitive proximity sensors, by generation and measurement of electric alternating fields, the approach of an object to the sensor electrodes of the proximity sensor is measured without contact. From the measuring signal functions can be derived, for example switching functions of an electric hand-held device. For the approximation detection without contact of an object to a capacitive proximity sensor different solutions are known from prior art, which distinguish in the way of the signal production and of measurement.

A first principle known from prior art for capacitive approximation detection provides the use of a capacitive proximity sensor with only one electrode. In this measurement system the capacity of the electrode is detected and evaluated in relation to the ground potential of the measuring electronics of the capacitive proximity sensor. This measurement system is also called loading method. If an object, for example a user, approaches the sensor electrode, the capacity at the sensor electrode changes, which can be detected and evaluated accordingly.

Another measurement system known from prior art provides a capacitive proximity sensor with two sensor electrodes. One sensor electrode operates as transmitting electrode and the other sensor electrode as reception electrode. The electric alternating field emitted at the transmitting electrode is coupled into the reception electrode and measured by means of an electrical signal tapped at the reception electrode. This method is also called transmission method, as it measures the transmission between a transmitter and a receiver. In case of approach of a user to the sensor electrodes the alternating electric field formed between the transmitting electrode and the reception electrode changes, which can be measured and evaluated accordingly.

The loading method, which measures the capacitive load against a reference knot (preferably the ground of an electric device), is preferably used in grounded systems. The transmission method, which measures the transmission between a transmitter and a receiver, is preferably used for battery-operated i.e. free-of-ground systems.

The disadvantage of the capacitive proximity sensors known from prior art is on the one hand the dependence of the capacitive proximity sensor on the parasitic capacitive loop over people, for example a user and ground. This means that the measuring signal depends on the grounding conditions of the capacitive sensor on the one hand and on the grounding conditions of the object which approaches the capacitive proximity sensor on the other hand. If the concrete grounding conditions of the capacitive proximity sensor or of the object are not known, a correct measurement of an approach of the object to the capacitive proximity sensor cannot be guaranteed.

On the other hand interference, for example by interfering electric fields, from the environment of the capacitive sensor on the sensor electrodes of the capacitive proximity sensor is problematic, because such interference can have a negative impact on the result of the measurement. Such interference or interfering electric fields can be caused for example by neighbouring electronic components in complex systems, like mobile phones. In order to avoid such interference or interfering electric fields, additional measures must be taken which avoid the coupling of external interfering fields into the sensor electrodes of the capacitive proximity sensor as far as possible, ideally completely. Such measures however lead to an increased structural expenditure, which affects the material and production cost of the capacitive proximity sensor or the electric device in which the capacitive proximity sensor is integrated.

A possibility known from prior art to prevent the coupling of external electric interfering fields into the sensor electrode of the capacitive proximity sensor consists in shielding the sensor electrodes of the proximity sensor against other electronic components in a complex system, which can take place for example with the help of a screen electrode. In this respect it is however disadvantageous that a screen electrode can occupy or must occupy a large amount of space in order to guarantee safe shielding. Especially when using capacitive proximity sensors in electric hand-held devices, for example mobile phones, it is desirable to do without such screen electrodes in order to reach a possibly compact design of the electric hand-held device.

SUMMARY

According to various embodiments a capacitive proximity sensor and a method for the capacitive approximation detection can be provided which avoid the disadvantages known from prior art at least partially and guarantee a reliable and robust detection of an approach of an object to the sensor electrodes of a capacitive proximity sensor. Especially according to various embodiments a capacitive proximity sensor and a method for the capacitive approximation detection can be provided which are to a great extent independent of influences of external interfering fields and of the grounding conditions of the sensor electronics on the one hand and of an object approaching to the sensor electrodes on the other hand.

According to an embodiment a capacitive proximity sensor comprises
  a first sensor electrode and a second sensor electrode,
  a signal generator for providing a first electric alternating signal and a second electric alternating signal,
  a first load element, which comprises a first electric load and a second electric load, in which the first electric alternating signal by means of the first electric load can be fed to the first sensor electrode and the second electric alternating signal can be fed by means of the second electric load to the second sensor electrode, and wherein the electric loads each time together with the capacitive load to be measured at the respective sensor electrode form a lowpass filter, and a signal processing device, which is coupled with the first sensor electrode and with the second sensor electrode, and which is adapted in order to form a first measurement value from the push-pull portion of a first electric variable at the first sensor electrode and a second electric variable tapped at the second sensor electrode.

The signal processing device may include a first amplifying circuit which is formed preferably as fully differential amplifier and which selects the push-pull portions of the first electric variable and the second electric variable.

The signal processing device may be adapted to form the first measurement value from the difference between the first electric variable and the second electric variable.

The first electric alternating signal preferably has the same amplitude as the second electric alternating signal. Preferably the first electric alternating signal has a phase shift of 180° as to the second electric alternating signal.

The signal processing device moreover can be adapted, to form a second measurement value from the common mode portion of the first electric parameter and second electric parameter tapped at the sensor electrodes.

The signal processing device can, for the formation of the second measurement value, include a second amplifying circuit, which is formed preferably as an impedance converter, in which the sum of the first electric parameter and the second electric parameter can be fed to the not inverting entry of the impedance converter.

The proximity sensor may further include a field disturbing electrode, on which a third electric alternating signal can be applied.

The proximity sensor may further include a third amplifying circuit, which comprises the first load element.

The proximity sensor may further include a second load element, which is coupled with the signal generator, wherein the output signals of the second load element can be fed to the signal processing device.

The proximity sensor may further include a fourth amplifying circuit, which comprises the second load element.

The sensor electrodes and the exit of the second load element can be coupled in such a way with the entries of the first amplifying circuit that the first amplifying circuit at its exits provides the difference between the signals tapped at the sensor electrodes and the output signals of the second load element.

It is advantageous if the first sensor electrode is coupled with the inverting exit of the third amplifying circuit, the second sensor electrode is coupled with the not inverting exit of the third amplifying circuit, the first electric alternating signal can be fed to the inverting entries of the third amplifying circuit and the fourth amplifying circuit, the second electric alternating signal can be fed to the not inverting entries of the third amplifying circuit and the fourth amplifying circuit, a first composite signal, which is formed from the electric signal tapped at the first sensor electrode and the signal applied at the not inverting exit of the fourth amplifying circuit, can be fed to the inverting entry of the first amplifying circuit, and a second composite signal, which is formed from the electric signal tapped at the second sensor electrode and the signal applied at the inverting exit of the fourth amplifying circuit, can be fed to the not inverting entry of the first amplifying circuit.

The amplification of the fourth amplifying circuit can be adjustable.

Also a method for the approximation detection is provided, wherein a first sensor electrode is fed with a first electric alternating signal and a second sensor electrode with a second electric alternating signal, wherein the electric alternating signals are applied to the sensor electrodes by means of a first load element, and from the push-pull portion of a first electric parameter, which is tapped at the first sensor electrode, and that of a second electric parameter, which is tapped at the second sensor electrode, a first measurement value is formed, wherein the first measurement value is indicative for the approach of the object to the sensor electrodes.

The electric alternating signals are preferably selected in such a way that the first electric alternating signal preferably comprises the same amplitude as the second electric alternating signal and that the electric alternating signals are preferably dephased by 180° to each other.

From the common mode portion of the first electric parameter and of the second electric parameter a second measurement value is formed.

A second load element can be fed with the first electric alternating signal and the second electric alternating signal, wherein the exits of the first load element and of the second load element are coupled with the entries of a first amplifying circuit in such a way that the first amplifying circuit at its exits provides the difference between the output signals of the first load element and the output signals of the second load element.

Moreover a hand-held device is provided, especially an electrical hand-held device, which comprises at least one capacitive proximity sensor according to various embodiments.

The electric hand-held device can be a smart phone, a two-way radio, a computer mouse, a remote control device, a digital camera, a game controller, a PDA, a tablet PC, a deaf-aid, a dictating machine, or similar.

BRIEF DESCRIPTION OF THE DRAWINGS

Further details and characteristics of the invention as well as concrete embodiments of the invention result from the following description in connection with the drawing. The figures show.

DETAILED DESCRIPTION

Figure 1:
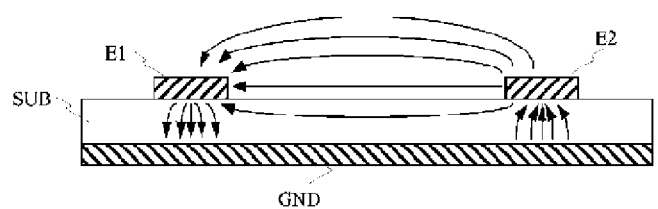
FIG. 1 the electric flux lines of a capacitive proximity sensor according to an embodiment with the sensor idle.

FIG. 1 shows electric flux lines in a capacitive proximity sensor, the structure of which is described in more detail in FIG. 2 to FIG. 10.

The sensor electrodes E1 and E2 of a capacitive proximity sensor according to various embodiments are fed with a differential signal, so that between the two electrodes E1 and E2 a push-pull signal is generated, which leads to a potential difference between the two electrodes and causes the formation of an alternating electric field between the two electrodes.

Figure 2:
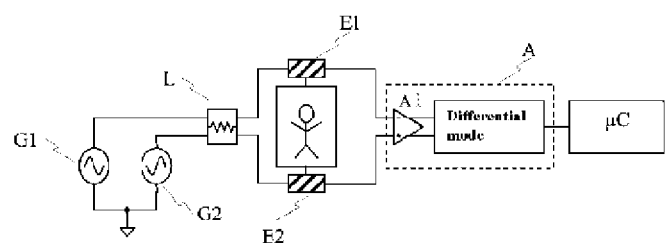
FIG. 2 a block scheme of a first embodiment of a capacitive proximity sensor.

FIG. 2 shows a block scheme of a first embodiment of a capacitive proximity sensor. The capacitive proximity sensor substantially comprises two sensor electrodes, a signal generator, an electric load element and an electric circuit for separating a push-pull portion from a common mode portion of an electric signal.

The sensor electrodes include a first sensor electrode E1 and a second sensor electrode E2, which in the sensor system operate on an equal footing and represent transmission and reception electrodes at the same time. The signal generator is coupled with the two sensor electrodes E1 and E2 by means of the electric load element L. The signal generator provides a differential alternating voltage, which is fed to the sensor electrodes E1 and E2 by means of the electric load element L. The signal generator can include two asymmetric generators G1 and G2, which each generate an identical signal, in which the signal of the generator G1 presents a phase difference of 180° from the signal of the generator G2. By means of the electric load L the signal of the first generator G1 is fed to the first sensor electrode E1, while the signal of the generator G2 dephased by 180° is fed to the second sensor electrode E2 by means of the load element L.

The electric load L together with the capacitive load to be measured, which is formed by an object approaching the sensor electrodes E1, E2, constitutes a lowpass filter of the first order. The electric load L can be realized for example by means of resistors. The electric load can however also be realized by the load of an upstream differential amplifier. The load can be part of the differential amplifier.

The circuit A for separating the push-pull portion from the common mode portion of an electric signal can be realized for example by means of a fully differential amplifier A1. The push-pull signal influenced by an electrically conductive object between the sensor electrodes E1 and E2 can be selected with the help of the fully differential amplifier A1 and be fed to a differential mode evaluating device (differential receiving and evaluating device). The differential mode evaluating device can be implemented separately or be provided as part of a larger signal processing unit, for example a microcontroller. The differential mode evaluating device can be fed with the differential output signal of the amplifier A1. Alternatively only one of the two signal conductors can be fed for further processing to the differential mode evaluating device. In a still further alternative the differential output signal of the fully differential amplifier A1 can be transformed into a grounded signal, which is then fed to the differential mode evaluating device.

Figure 4:
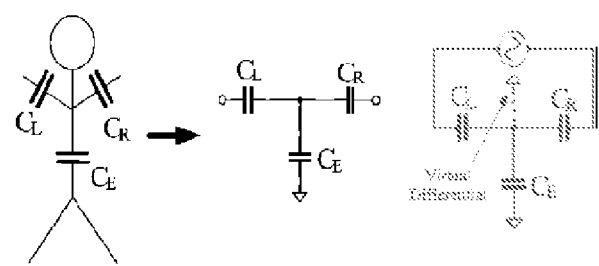
FIG. 4 a capacitive equivalent circuit of a person.
Figure 5:
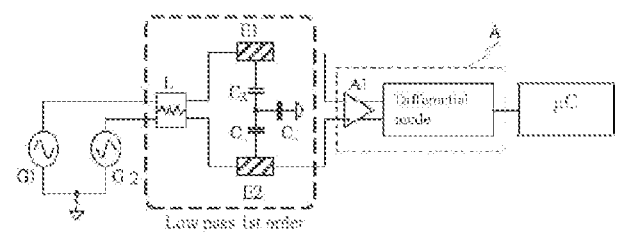
FIG. 5 the block diagram shown in FIG. 2 of a capacitive proximity sensor according to an embodiment together with the capacitive equivalent circuit from FIG. 4, in which the human being represents a part of a lowpass filter of the first order.

As can be seen in FIG. 2, the load L of the fully differential amplifier A1 is switched in parallel with the electrode pair E1 and E2. Altogether this results in a low pass of the first order taking into account the capacitive network introduced by the person. The introduced capacitance can be approximated by a capacitive equivalent network, as can be seen in FIGS. 4 and 5. The electric load L is preferably sized in such a way that in case of an approach of a person to the sensor electrodes E1, E2 between the states "no person in the electric alternating field" and "maximum approach" a maximum change of amount in the transfer function of the lowpass filter results. The level is always reduced in case of an approach of a person to the sensor electrode, because the time constant of the filter rises and the effective cut-off frequency of the filter lowers.

Features of the capacitive proximity sensor are the differential signal, with which the filter is excited as well as the downstream differential mode-evaluation, which is provided with the help of the fully differential amplifier A1 and the differential mode evaluating device. Usually in a system with three conductors (two signal conductors and ground), as in the capacitive proximity sensor described here, the existence of two kinds of signal is possible, each signal having characteristic properties. The two kinds of signal comprise the so-called push-pull signals and the so-called common mode signals.

The push-pull signals are characterized by a same amplitude on both signal conductors with a phase offset of exactly 180°. The signals are thus identical, except for the phase shift. As the signal voltage is directed against the other signal conductor, between both signals a so-called virtual ground results, which has certain properties in common with the real earth ground. Thus for a alternating signal virtual ground and earth ground are on the same potential, which means that between them no flow of current takes place.

Common mode signals are characterized by the same amplitude on both signal conductors with perfectly identical phase. As the common mode portion always presents equal potential on both signal conductors, circuit parts independent of ground between the signal conductors are not crossed by common mode currents.

The signals on a pair of conductors can always be split into the two above mentioned parts (push-pull portion and common mode portion). Essential for the capacitive proximity sensor according to various embodiments is the push-pull signal, which is generated and provided by the signal generators G1 and G2, fed to the electrodes E1 and E2 and afterwards is evaluated. As parasitic signals couple into the sensor system or into the sensor electrodes E1 and E2 mostly as common mode interference, they are deleted in the differential mode evaluation (cf. FIG. 3) and do not impair further processing. The capacitive proximity sensor according to various embodiments is therefore particularly robust against interference.

Figure 3:
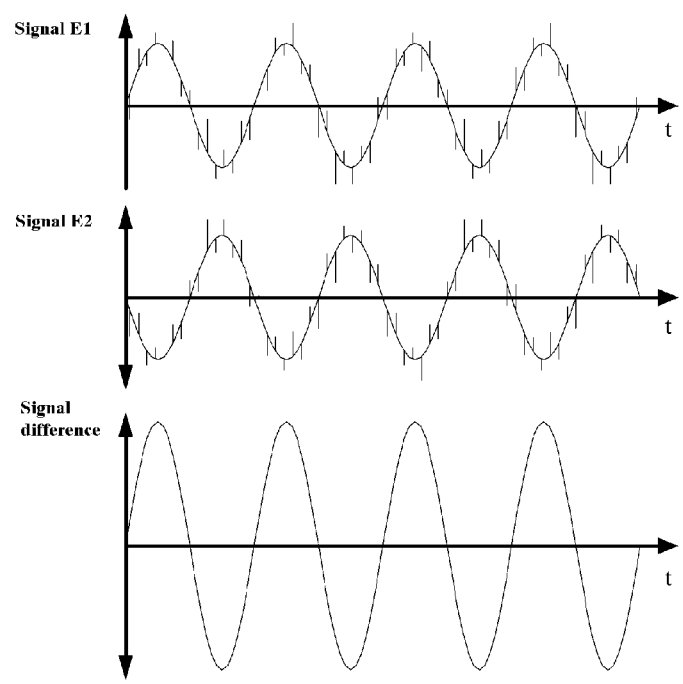
FIG. 3 the signal curves of the electric signals tapped at two sensor electrodes of the capacitive proximity sensor according to an embodiment as well as the differential signal resulting from this.

FIG. 3 shows signal curves of the signals to be expected at the sensor electrodes E1 and E2 if near the sensor electrodes further electronic components are active, as it can be the case for example in a mobile phone. In this case a superposition of the desired signal with parasitic signals, which can be generated for example by digital circuits or switching regulators, is possible. The superposition of the signals at the sensor electrodes E1 and E2 with parasitic signals can affect the further signal processing negatively. The parasitic signals appear in the form of common mode signals (deflection in the same direction on both signal conductors) on a desired push-pull signal (deflection in different directions on both signal conductors). By the following differential mode selection in the amplifying circuit A1, which can be formed as full differential amplifier, the sensor signal is freed of the parasitic signals. Such a sensor signal free of parasitic signals is shown in the lower signal curve in FIG. 3, representing the signal difference of the sensor signals at the electrodes E1 and E2. In the signal processed by the amplifying circuit A1 the parasitic signals are no longer contained, so that the differential sensor signal provided by the amplifying circuit A1 can be processed without parasitic signals influencing the further processing.

Alternatively the signal can also be processed digitally, for example with a micro controller, and the parasitic signals can be removed.

FIG. 4 shows, in simplified form, the capacitive network generated by a person, which substantially consists of the capacitance CL (left hand), the capacitance CR (right hand) and a capacitance CE (earth capacitance). In case of differential mode excitation, i.e. when feeding the sensor electrodes E1 and E2 with a differential generator signal, and under the condition CL=CR (the condition CL=CR represents the ideal case of the capacitive network shown in FIG. 4 show) a virtual ground forms by means of the capacitance CE. The capacitance CE is then short-circuited and no longer modifies the sensor signals at the sensor electrodes E1 and E2. Because of the property of the virtual ground, the body capacitance is now to a great extent (even completely, if the capacities at both coupling-in points are of the same size, i.e., CL=CR) between earth and virtual ground and thus is short-circuited. As in case of an approach for grasping, for example, a mobile phone or for laying a hand, for example, on a computer mouse, a capacitance of similar size at both sensor electrodes E1, E2 can be supposed, the detection at the sensor electrodes E1, E2 and the following evaluation of the signals tapped at the sensor electrodes E1 and E2 is to a great extent independent of earth influences on people. It has shown that in practice also under the condition CL CR (in which the difference between CL and CR is inside certain limits) a robust and reliable detection is guaranteed.

FIG. 5 shows a capacitive proximity sensor with the capacitive network formed by the person. The electric load L constitutes together with this network a low pass of the first order, the effective cut-off frequency of which varies with the size of the capacities CL, CR and CE. If one replaces the sinus sources G1, G2 shown in FIG. 5 by two rectangular generators, instead of the frequency-dependent amplitude the charging current into the capacitive network can be measured.

Figure 6:
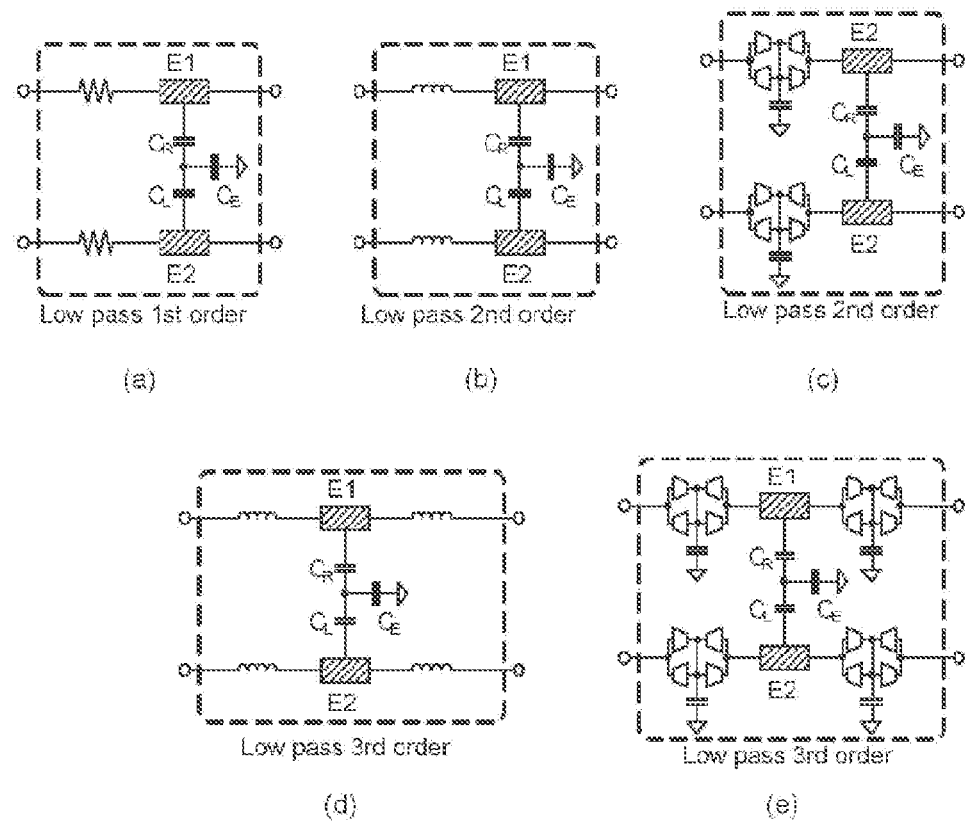
FIG. 6 alternatives to the lowpass filter of the first order shown in FIG. 5 as a lowpass filter of the second order and a lowpass filter of the third order.

The low pass of the first order shown in FIG. 5 can be extended by the use of coils, as shown in FIG. 6.

FIG. 6 shows extensions of the low pass of the first order (which is shown in FIG. 6a) by each time one filter order to form low passes of the second order (which are shown in FIGS. 6b and 6c) and low passes of the third order (which are shown in FIGS. 6d and 6). The advantage of such extensions to form low passes of a higher order is that the flank of the filter becomes steeper with every order (+20 dB/decade per filter order). In this way with a fixed measuring frequency and a changing capacitance a consistent change of the signal amplitude of the signals tapped at the sensor electrodes E1, E2 results. The substantial advantage is that the scenarios "object in the electric alternating field" and "no object in the electric alternating field" can be distinguished from each other much better, which results in a more robust detection. Moreover with a filter of a higher order also the sensitivity of the capacitive proximity sensor can be increased.

Because however coils (as can be seen in FIGS. 6b and 6d), above all in integrated circuits, because of their immense surface requirement are disadvantageous, they can be replaced by gyrators or impedance inverters (as can be seen in FIGS. 6c and 6e), which transform the transfer function of a capacitance into that of a coil. The use of gyrators or impedance inverters has moreover the advantage that the production of capacitive proximity sensors can be much more cost efficient.

FIG. 6a shows a low pass of the first order, FIG. 6b and FIG. 6c each show a low pass of the second order and FIG. 6d and FIG. 6e each show a low pass of the third order.

According to various embodiments the capacitive proximity sensor can be extended by a receiving and evaluating device for processing the common mode signal to be tapped at the sensor electrodes E1, E2.

Figure 7:
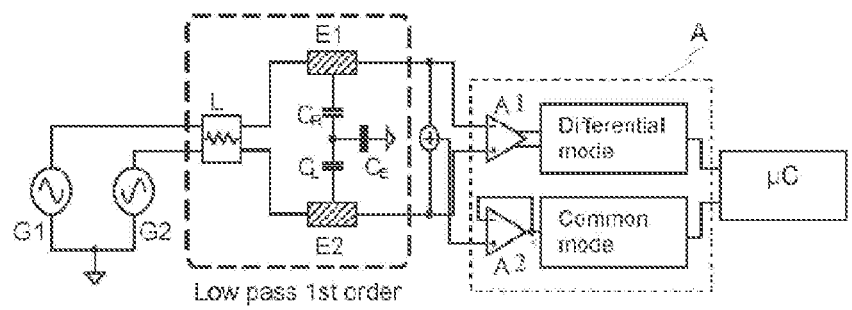
FIG. 7 a block diagram of a further embodiment of a capacitive proximity sensor, which in addition to the differential mode evaluation also provides a common mode evaluation.

An embodiment with a common mode-evaluation is shown in FIG. 7. The sensor functionality, as it has been described in regard to FIG. 1 till FIG. 6, is completely maintained here and is not influenced by the common mode-evaluation, which substantially can take place parallelly to the differential mode evaluation. According to various embodiments, besides the desired push-pull signal, also the common mode signal resulting from the ground reference of the person can be evaluated and processed by the additional common mode evaluation.

The common mode evaluation, which can be a component of the signal processing, substantially comprises a second amplifying circuit A2, the exit of which is coupled with a receiving and evaluating device for evaluating the common mode signal. The amplifying circuit A2 can be formed as an impedance converter and serve as buffer-amplifier, in which the not inverting entry of the impedance converter is fed with the sum of the electric signals tapped at the sensor electrodes E1 and E2. The addition of the signals tapped at the electrodes E1 and E2 is preferably done in such a way that the electrodes E1 and E2 are substantially not charged.

In combination with the push-pull signal the following signal conditions can be extracted:

push-pull signal maximal and common mode signal minimal: there is no person in the electric alternating field of the electrodes E1 and E2.

reduction of the push-pull signal is measurable and the amplitude of the common mode signal is low: a person is approaching almost equally both electrodes.

reduction of the push-pull signal is measurable and the common mode signal presents a large amplitude: a person is approaching the electrodes E1, E2, but one electrode more than the other, which according to the embodiment shown in FIG. 7 is the electrode E1.

reduction of the push-pull signal is measurable and the amplitude of the common mode signal is ample and the common mode signal is anti-phase to the push-pull signal: a person is approaching the electrodes E1, E2 but more the other electrode, which according to the embodiment shown in FIG. 7 is the electrode E2.

With the aid of the common mode signal thus also the direction of the approach of an electrically conductive object, for example a person, to the sensor electrodes E1, E2 can be detected. In this way additional functions can be realized with the help of the capacitive proximity sensor according to various embodiments, for example so-called sliders or wheels (slide controls or knobs).

The evaluation of the push-pull signal and of the common mode signal can take place simultaneously, i.e. substantially parallelly. The evaluation of both signals can take place preferably during the same measuring cycle, so that a saving of energy or, in case of constant energy balance, a higher sampling rate can be obtained.

Figure 8:
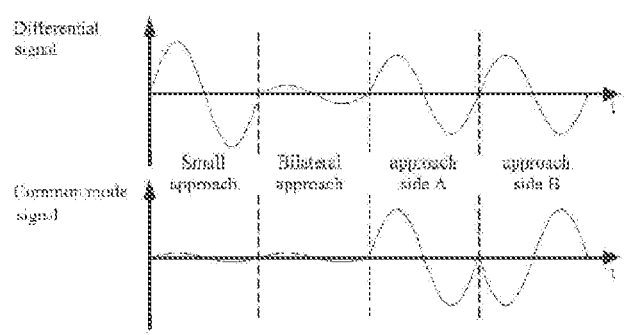
FIG. 8 the signal curves of a push-pull signal and a common mode signal, the way they are provided by a capacitive proximity sensor according to FIG. 7.

In FIG. 8 the four aforementioned signal conditions are illustrated as signal curves of the push-pull signal and of the common mode signal over time.

In the first time interval or at a first moment the distance of an object from the sensor electrodes is large and the distance of the object from every sensor electrode is substantially identical. The amplitude of the push-pull signal is high and the amplitude of the common mode signal very low.

In the second time interval or at a second moment the distance of an object from the sensor electrodes is small and the distance of the object from every sensor electrode is substantially identical. The amplitude of the push-pull signal and the amplitude of the common mode signal are each very low.

In the third time interval or at a third moment an object is situated in the electric alternating field of the sensor electrodes E1, E2, the distance of the object from the sensor electrode E1 being smaller than the distance of the object from the sensor electrode E2. The reduction of the amplitude of the push-pull signal is measurable and the amplitude of the common mode signal is high, the common mode signal being in phase with the push-pull signal.

In the fourth time interval or at a fourth moment an object is situated in the electric alternating field of the sensor electrodes E1, E2, the distance of the object from the second sensor electrode E2 being smaller than the distance of the object from the first sensor electrode E1. Here too the reduction of the amplitude of the push-pull signal is measurable, the amplitude of the common mode signal is high and the common mode signal presents a phase offset of 180° from the push-pull signal.

Figure 9:
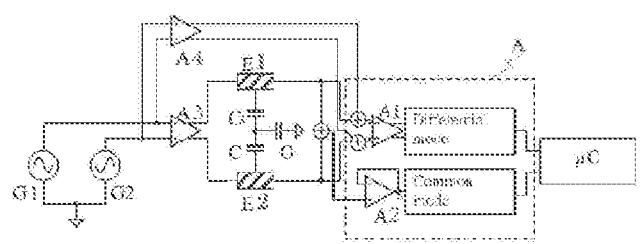
FIG. 9 another embodiment of a capacitive proximity sensor, which allows a compensation of production tolerances.

The proximity sensor according to various embodiments can be extended for the compensation of production tolerances. An embodiment of such an extension of the capacitive proximity sensor is shown in FIG. 9.

For this purpose the capacitive proximity sensor shown in FIG. 7 is extended by a so-called "imitation". With the imitation the electric load L shown in FIG. 7 is imitated, i.e. another electric load is provided, which substantially presents the same properties as the electric load L shown in FIG. 7. Preferably the electric load L and the imitated load are each part of an amplifying circuit, which are shown in FIG. 9 as amplifying circuit A3 and amplifying circuit A4. The electric load L shown in FIG. 7 is in this respect part of the amplifying circuit A3.

The amplifying circuits A3 and A4 are fed each identically with the signals of the signal generators G1 and G2, in which however the exits of the amplifying circuit A4 are not coupled with the electrodes E1, E2. The exits of the amplifying circuit A4 and the exits of the amplifying circuit A3 or the electrodes E1 and E2 are connected in such a way to the following differential amplifier A1, that the differential output signal of the differential amplifier A1 represents the difference of the output signals of the amplifying circuit A3 and of the amplifying circuit A4.

The inverting entry of the differential amplifier A1 is fed with a composite signal which is formed from the signal at the non-inverting exit of the amplifying circuit A4 and the signal from the inverting exit of the amplifying circuit A3 or from the signal tapped at the first sensor electrode E1. The non-inverting entry of the differential amplifying circuit A1 is fed with a composite signal which is formed from the signal at the inverting exit of the amplifying circuit A4 and from the signal from the non-inverting exit of the amplifying circuit A3 or from the signal tapped at the second sensor electrode E2.

Without approach of an object to the sensor electrodes E1, E2 both signal paths are identical, so that the differential output signal of the amplifier A1 is almost zero or equal to zero. If an electrically conductive object approaches the electrodes E1, E2, the signal at the electrodes E1, E2 reduces, so that a difference at the entries of the fully differential amplifier A1 results, which leads to a signal rise at the exits of the amplifier A1.

In this way global production fluctuations of the load, as they can occur very markedly above all in semiconductor circuits, can be compensated, because the load of the amplifying circuit A3 and that of the amplifying circuit A4 imitating the load of the amplifying circuit A3 oscillate globally substantially equally.

Preferably the amplifying circuit A4 is adjustable in its amplification, so that besides the compensation of production fluctuations also parasitic base loads can be compensated effectively.

Figure 10:
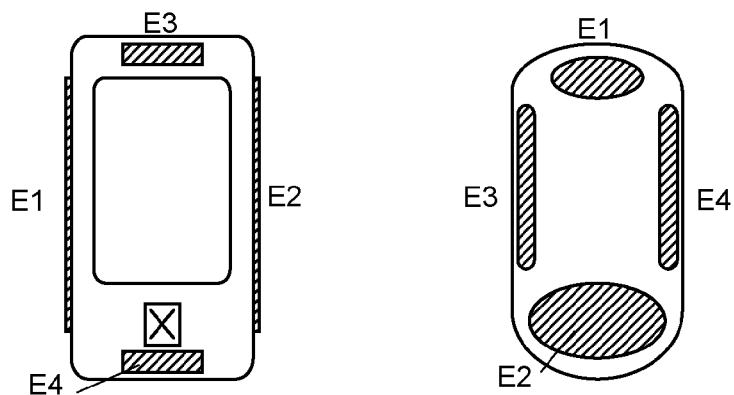
FIG. 10 two application cases using each time two capacitive proximity sensors according to an embodiment in an electric hand-held device.

FIG. 10 shows an application example of the capacitive proximity sensor according to various embodiments in a mobile phone or in a computer mouse. The electrode pairs E1 and E2 or E3 and E4 each represent a sensor zone, which can serve both for detecting the grasping of the mobile phone and for detecting a hand laid on the computer mouse. At the same time the electrode pairs can be also used as button or slider. In combination of both sensor zones (which can be operated preferably in a time division multiplex) also knobs (wheels) can be implemented.

The electrode pairs E1, E2 or E3, E4 can be operated with the same measuring electronics, the electrode pairs being connected to the measuring electronics in the multiplex operation (time-division multiplex). In the multiplex operation also the electric load can be adjusted accordingly. For example the electric load for the first electrode pair E1, E2 can be different from the electric load for the second electrode pair E3, E4. The adjustment of the electric load can be advantageous if the arrangement of the electrodes in relation to each other of the respective electrode pairs each time is different, in which by adjusting the electric load the sensor precision for both electrode pairs is maintained substantially equal.

Figure 11:
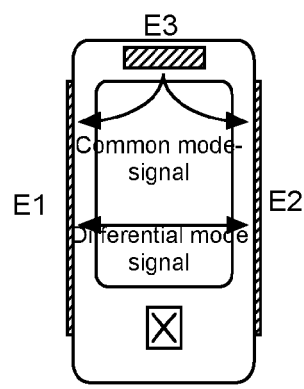
FIG. 11 a capacitive proximity sensor according to an embodiment, which additionally provides a field disturbing electrode.

FIG. 11 shows an application example of a capacitive proximity sensor with an additional electrode E3, which is introduced into the system as field disturbing electrode. At the field disturbing electrode E3 at the moment of measurement an alternating electrical field is emitted, which in case of approach of an electrically conductive object to the sensor electrodes over this object couples into one or in both sensor electrodes E1, E2. As soon as a capacitive coupling between the field disturbing electrode E3 and the sensor electrodes E1, E2 is produced, the common mode potential of the capacitive proximity sensor is influenced by the new component of the field disturbing electrode. The alternating electric field of the field disturbing electrode E3 coupled into the sensor electrodes E1, E2 over the electrically conductive object leads to an increase of the common mode level of the electric signals tapped at the sensor electrodes E1, E2. The signal of the field disturbing electrode can be different in amplitude, phase and/or frequency from the differential signal of the capacitive proximity sensor, so that it can be assigned precisely to the field disturbing electrode E3.

In conclusion here are again the benefits of the capacitive sensor device according to various embodiments.

A particular advantage of the capacitive proximity sensor according to various embodiments is that it can be used for detecting an approach of a human body to a device, for example an electric hand-held device, in which the functioning of the proximity sensor is guaranteed both in a poorly grounded and in a highly grounded scenario as well as in case of strong interference.

With a view to the abovementioned transmission systems and loading systems a reduction of the influence of the coupling between the ground of the device and earth is reached, or a reduction of the influence of earth on people. In battery-operated devices the ground coupling is mostly very bad so that only a poor capacitance change is reached by an approach of an electrically conductive object, which is difficult to be measured. In the capacitive proximity sensor according to various embodiments in the first place the capacitance between the sensor electrodes is measured, as the body capacitance is to a great extent short-circuited against ground by the virtual ground.

Because of the additional possibility of the common mode evaluation, simultaneously with the differential mode evaluation additional functions can be realized (for example buttons or sliders), which is possible without additional cost in the hardware or in the quantity of electrodes. The common mode evaluation can take place simultaneously with the differential mode evaluation, which means current savings compared to a separate capacitive sensor.

Compared to the abovementioned transmission systems known from prior art, in the capacitive proximity sensor according to various embodiments there are only electrodes of the same type. In a transmission system known from prior art one electrode is operated as transmitting electrode and another electrode as receiver electrode. In the case of a low-resistance connection between human being and ground of the device the transmitter is short-circuited, which may entail a total failure of the sensor system. This disadvantage is avoided in the capacitive proximity system according to various embodiments.

As to asymmetric sensor systems, the capacitive proximity sensor according to various embodiments has a much higher resistance against all spurious signals the wavelength of which is larger than the distance of the electrodes. Possible interference signals or sources for interference signals can be for example switching regulators, other sensor systems or digital systems. The increased or improved resistance against interference of the capacitive sensor device according to various embodiments is especially advantageous if the sensor electrodes for cost or implementation reasons have to be built without rear grounding surface.

What is claimed is:

1. Capacitive proximity sensor, comprising
a first sensor electrode and a second sensor electrode,
a signal generator configured to provide a differential alternating signal comprising a first electric alternating signal and a second electric alternating signal,
a first load element, which comprises a first electric load and a second electric load, wherein the first electric alternating signal is fed to the first sensor electrode through the first electric load and the second electric alternating signal is fed to the second sensor electrode through the second electric load, and wherein the first and second electric loads together with a capacitive load to be measured at the respective sensor electrode form a lowpass filter, respectively;
a second load element having an input coupled with the signal generator and an output providing a differential output signal; and
a signal processing device coupled with the first sensor electrode and with the second sensor electrode, wherein the signal processing device comprises a first differential amplifier receiving a difference between the differential output signal of the second load element and a differential signal provided by signals from the first and second sensor electrodes, respectively.

2. The capacitive proximity sensor according to claim 1, in which the first electric alternating signal has the same amplitude as the second electric alternating signal and/or in which the first electric alternating signal presents a phase shift of 180° from the second electric alternating signal.

3. The capacitive proximity sensor according to claim 1, wherein the signal processing device further is adapted to form a second measurement value from a common mode portion of the signals from the first and second sensor electrodes.

4. The capacitive proximity sensor according to claim 3, wherein the signal processing device for forming the second measurement value comprises an impedance converter, wherein a non-inverting input of the impedance converter receives a sum of the signals from the first and second sensor electrodes.

5. The capacitive proximity sensor according to claim 1, further comprising a field disturbing electrode, which can be fed with a third electric alternating signal.

6. The capacitive proximity sensor according to claim 1, further comprising a first amplifying circuit, which comprises the first load element.

7. The capacitive proximity sensor according to claim 6, further comprising a second amplifying circuit, which comprises the second load element.

8. The capacitive proximity sensor according to claim 7, wherein the first amplifying circuit and the second amplifying circuit each comprise a differential output.

9. The capacitive proximity sensor according to claim 8, in which
the first sensor electrode is coupled with the inverting output of the first amplifying circuit,
the second sensor electrode is coupled with the non-inverting output of the first amplifying circuit,
the first electric alternating signal is fed to the inverting inputs of the first amplifying circuit and the second amplifying circuit,
the second electric alternating signal is fed to the non-inverting inputs of the first amplifying circuit and the second amplifying circuit,
a first composite signal, which is formed from the electric signal tapped at the first sensor electrode and the signal at the non-inverting output of the first amplifying circuit, is fed to the inverting input of the first differential amplifier in said signal processing device, and
a second composite signal, which is formed from the electric signal tapped at the second sensor electrode and the signal at the inverting output of the second amplifying circuit, is fed to the non-inverting input of the first differential amplifier in said signal processing device.

10. The capacitive proximity sensor according to claim 7, wherein the amplification of the second amplifying circuit is adjustable.

11. A method for the approximation detection of an object, comprising the steps of:
  feeding a first electric alternating signal to a first sensor electrode and a second alternating signal to a second sensor electrode, wherein the first and second alternating signals form a differential alternating signal, wherein the electric alternating signals are fed to the sensor electrodes through a first load element,
  feeding the differential alternating signal to a second load element;
  receiving at a differential amplifier, a difference between a differential output signal of the second load element and a differential signal provided by signals from the first and second electrodes, respectively.

12. The method according to claim 11, wherein the electric alternating signals are selected in such a way that the first electric alternating signal presents the same amplitude as the second electric alternating signal and the electric alternating signals are dephased by 180° from each other.

13. The method according to claim 11, in which from a common mode portion of the differential signal from the first and second sensor electrode a second measurement value is formed.

14. The method according to claim 11,
  further comprising the step of providing a field disturbing electrode and feeding a third electric alternating signal to the field disturbing electrode.

15. Hand-held device comprising a capacitive proximity sensor, comprising:
  a first sensor electrode and a second sensor electrode,
  a signal generator configured to provide a differential alternating signal comprising a first electric alternating signal and a second electric alternating signal,
  a first load element, which comprises a first electric load and a second electric load, wherein the first electric alternating signal is fed to the first sensor electrode through the first electric load and the second electric alternating signal is fed to the second sensor electrode through the second electric load, and wherein the first and second electric loads together with a capacitive load to be measured at the respective sensor electrode form a lowpass filter, respectively;
  a second load element having an input coupled with the signal generator and an output providing a differential output signal; and
  a signal processing device coupled with the first sensor electrode and with the second sensor electrode wherein the signal processing device comprises a first differential amplifier receiving a difference between the differential output signal of the second load element and a differential signal provided by signals from the first and second electrodes, respectively.

16. The hand-held device according to claim 15, wherein the signal processing device comprises a first amplifying circuit which is formed as a differential amplifier and which selects push-pull portions of the differential signal at the first and second sensor electrodes.

17. The hand-held according to claim 15, wherein the signal processing device is adapted to subtract the differential signal at the first and second sensor electrodes from the differential output signal of the second load element.

* * * * *